(12) United States Patent
Adetutu et al.

(10) Patent No.: US 7,288,458 B2
(45) Date of Patent: Oct. 30, 2007

(54) SOI ACTIVE LAYER WITH DIFFERENT SURFACE ORIENTATION

(75) Inventors: Olubunmi O. Adetutu, Austin, TX (US); Robert E. Jones, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 11/302,770

(22) Filed: Dec. 14, 2005

(65) Prior Publication Data

US 2007/0134891 A1    Jun. 14, 2007

(51) Int. Cl.
*H01L 21/331* (2006.01)
*H01L 21/8222* (2006.01)

(52) U.S. Cl. ............... 438/311; 438/474; 438/513; 257/E21.17; 257/E21.127; 257/E21.218; 257/E21.248; 257/E21.304; 257/E21.32

(58) Field of Classification Search ........... 438/311, 438/197, 933, 474, 475, 680, 692, 513, 752, 438/753, 712
See application file for complete search history.

(56) References Cited

U.S. PATENT DOCUMENTS

| | | | |
|---|---|---|---|
| 5,384,473 A * | 1/1995 | Yoshikawa et al. | 257/255 |
| 6,616,854 B2 | 9/2003 | Jones et al. | |
| 6,635,543 B2 | 10/2003 | Furukawa et al. | |
| 7,125,785 B2 * | 10/2006 | Cohen et al. | 438/481 |
| 2005/0070077 A1 | 3/2005 | Guarini et al. | |
| 2006/0049460 A1 * | 3/2006 | Chen et al. | 257/347 |
| 2006/0105536 A1 * | 5/2006 | Cheng et al. | 438/386 |

OTHER PUBLICATIONS

M. Yang, et al., High Performance CMOS Fabricated on Hybrid Substrate With Different Crystal Orientations, 0-7803-7873-3/03, 2003 IEEE.
B. Doris, et al., A Simplified Hybrid Orientation Technology (SHOT) for High Performance CMOS, date unknown.
His-Jen J. Yeh, et al., Fluidic Self-Assembly for the Integration of GaAs Light-Emitting Diodes on Si Substrates, 1041-1135/94, 1994 IEEE.
Jennifer Ouellette, Exploiting Molecular Self-Assembly, Dec. 2000, American Institute of Physics pp. 26-29.
Olubunmi O. Adetutu, et al., Modified Dual Substrate Orientation, Filing Date—Apr. 27, 2005, U.S. Appl. No. 11/209,869.

* cited by examiner

*Primary Examiner*—David Nhu
(74) *Attorney, Agent, or Firm*—David G. Dolezal; James L. Clingan, Jr.

(57) ABSTRACT

A wafer having an SOI configuration and active regions having different surface orientations for different channel type transistors. In one example, semiconductor structures having a first surface orientation are formed on a donor wafer. Semiconductor structures having a second surface orientation are formed on a second wafer. Receptor openings are formed on the second wafer. The semiconductor structures having the first surface orientation are located in the receptor openings and transferred to the second wafer. The resultant wafer has semiconductor regions having a first surface orientation for a first channel type of transistor and semiconductor regions having a second surface orientation for a second channel type transistor.

21 Claims, 9 Drawing Sheets

SOI ACTIVE LAYER WITH DIFFERENT SURFACE ORIENTATION

BACKGROUND OF THE INVENTION

1. Field of the Invention

This invention relates in general to semiconductor devices and more particularly to devices implemented with semiconductor on insulator (SOI) technology.

2. Description of the Related Art

The surface orientation of a semiconductor material is descriptive of the lattice orientation of the material at the surface of the material. With some semiconductor circuits, it may be desirable to implement the P-channel transistors and N-channel transistors in semiconductor active regions having different surface orientations. For example, some N-channel transistors have a relatively higher electron mobility in silicon having a surface orientation (100) as opposed to the electron mobility of an N-channel transistor in silicon with a surface orientation (110). On the other hand, some P-channel transistors will have a higher hole mobility with their channels being implemented in silicon having a surface orientation (110) as opposed to silicon having a surface orientation (100).

Prior semiconductor devices have had semiconductor on insulator (SOI) configurations where the active semiconductor area for the N-channel transistors has a surface orientation of (100) and the active semiconductor area for the P-channel transistors has a surface orientation of (110). The different surface orientations are formed by removing areas of the active silicon layer having a first orientation (e.g. (100)) and removing the underlying oxide in those areas to expose a silicon substrate having a second surface orientation (e.g. (110)). Silicon is selectively expitaxially grown in the exposed areas such that the expitaxially grown silicon has the same surface orientation as the substrate. Oxygen is then implanted into the epitaxially grown silicon (and the wafer subsequently annealed) to form an insulator layer between the epitaxially grown silicon and the substrate. However, the selectively epitaxially grown silicon may include defects in the subsequently epitaxially grown silicon active layer e.g. at a boundary of the epitaxially grown silicon. Also, maintaining a clean surface on which to selectively grow the epitaxial silicon may be difficult due to different materials on the wafer and their pattern densities. Also, selective epitaxially grown silicon processes may lead to non epitaxial silicon growth on unwanted areas (e.g. on dielectrics). Furthermore, the insulator formation in the epitaxially grown silicon may generate defects in the epitaxially grown silicon active layer.

What is desirable is an improved process for forming a semiconductor device having an SOI configuration with active layers having different surface orientations.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
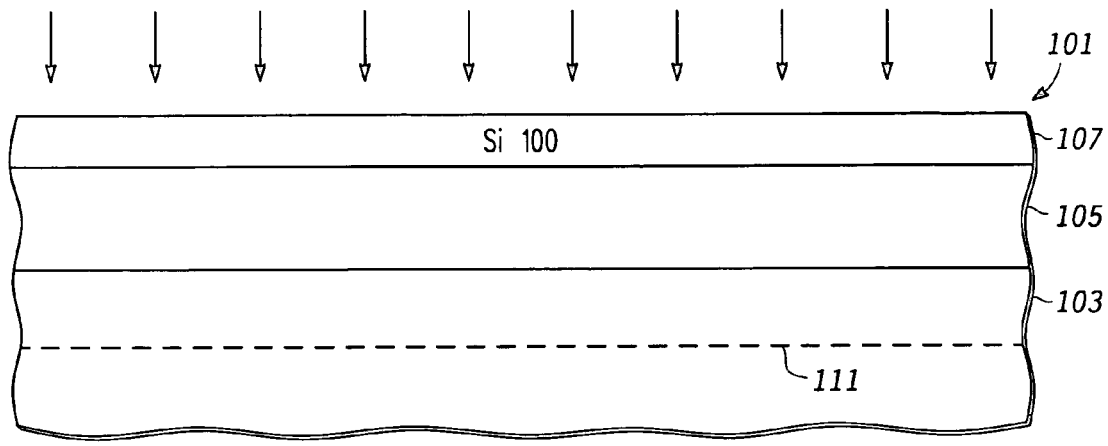
FIGS. 1-11 show partial cross sectional side views of various stages during the manufacture of semiconductor structures according to one embodiment of the present invention.

FIG. 1 is a partial cross sectional side view of a wafer utilized to form semiconductor structures having a particular surface orientation that will be located between areas of semiconductors structures of a second surface orientation of a second wafer to provide a resultant layer having structures of a first surface orientation and structures of a second surface orientation.

Wafer 101 has an SOI configuration with an active semiconductor layer (e.g. silicon, silicon germanium) 107 having a surface orientation (100). Layer 107 is on an insulator layer 105 (e.g. silicon oxide). Layer 105 is on substrate layer 103 (e.g. monocrystalline silicon). As shown in FIG. 1, hydrogen ions are implanted into substrate layer 103 to form a damaged region 111 that will be utilized in subsequent processes for cleaving substrate layer 103.

In one embodiment, layer 107 is formed by implanting oxygen ions into substrate layer 103 followed by a subsequent anneal to form insulating layer 105. In this embodiment, layer 107 has the same substrate orientation as substrate layer 103. However, in other embodiments, layer 107 may be a portion of a donor wafer (not shown) having a surface orientation of (100) that is subsequently bonded to wafer 101 and then cleaved to leave layer 107. With this embodiment, substrate layer 103 may have the same or different surface orientation from semiconductor layer 107.

In one embodiment, layer 107 has a thickness of 700 Angstroms, but may have other thickness (e.g. 20-1000 Angstroms) in other embodiments. However, other embodiments may be of other thicknesses. In one embodiment, insulator layer 105 has a thickness of 1400 Angstroms, but may be of other thicknesses in other embodiments. In some embodiments, wafer 101 does not include a semiconductor substrate layer.

Figure 2:
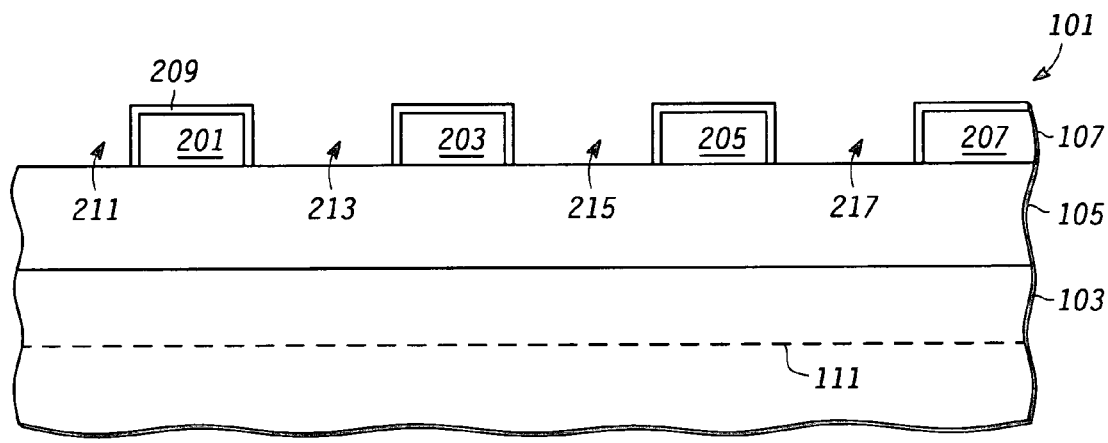

FIG. 2 is a cross sectional view of wafer 101 after portions of layer 107 have been patterned to form silicon structures 201, 203, 205, and 207 having a surface orientation (100). The patterning leaves openings 211, 213, 215, and 217 in layer 107 that expose insulator layer 105. Also shown in FIG. 2 is an oxide layer 209 subsequently formed (e.g. by oxidation or deposition) on structures 201, 203, 205, and 207 after the patterning.

In one embodiment, the patterning is performed by depositing a layer of photo resist (not shown) on layer 107, forming a pattern in the layer of photo resist by photolithographic techniques, remove portions of the photo resistor as per the pattern to expose portions of layer 107, and then etching the exposed portions of layer 107 (e.g. with $CF_4$) to form the structures 201, 203, 205, and 207. However, layer 107 may be patterned utilizing other conventional techniques in other embodiments.

Figure 3:
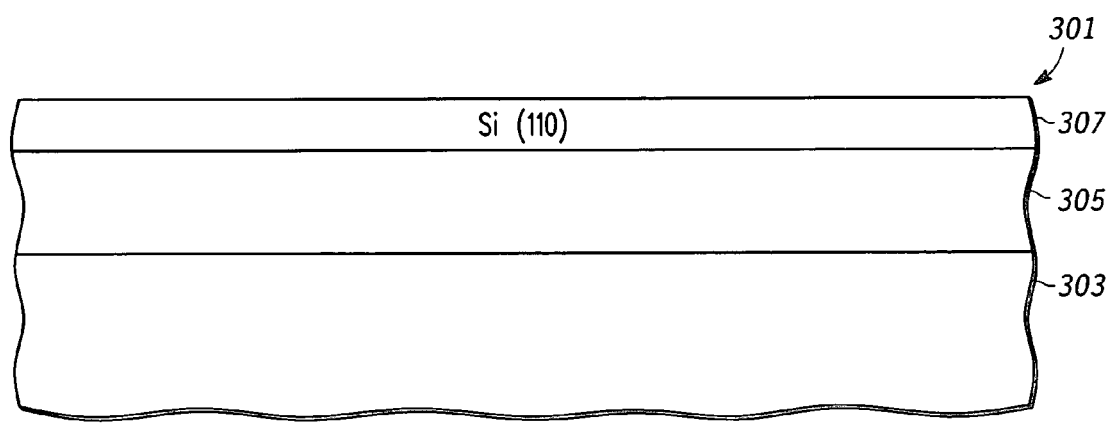

FIG. 3 is a cross sectional side view of wafer 301. Wafer 301 has a SOI configuration with a silicon layer 307 on an insulating layer 305. In the embodiment shown, layer 305 is on substrate layer 303. In the embodiment shown, layer 307 has a surface orientation (110).

In one embodiment, layer 307 is formed by implanting oxygen ions in substrate layer 303 followed by a subsequent anneal to form layer 305. In such an embodiment, substrate layer 303 has a surface orientation (110). In other embodiments, layer 307 is formed by bonding a donor wafer having a surface orientation (110) to layer 305 and subsequently removing a portion of the donor wafer by cleaving. With this embodiment, the substrate layer 303 may have the same or different surface orientation from semiconductor layer 107.

Figure 4:
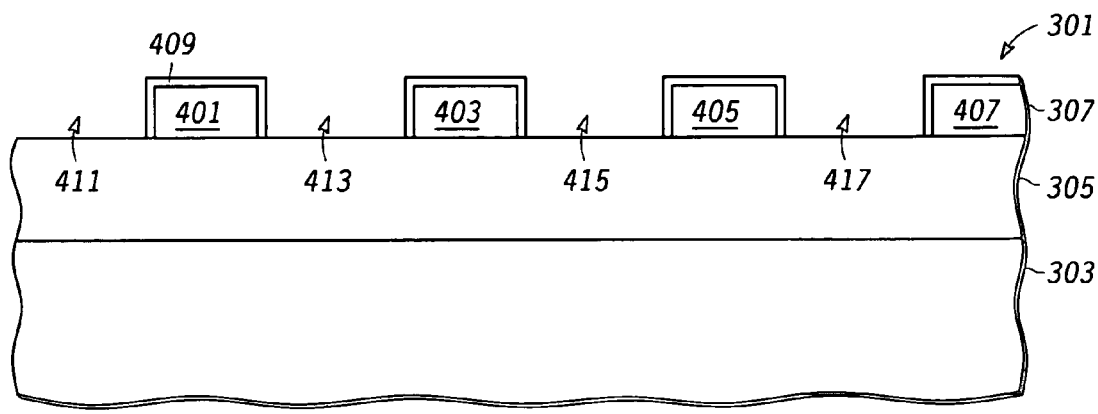

FIG. 4 is a cross sectional side view of wafer 301 after layer 307 has been patterned to form silicon structures 401, 403, 405, and 407 and to form openings 411, 413, 415, and 417 in layer 307. The openings expose portions of layer 305. In one embodiment, the patterning may be performed as describe above with respect to the patterning of layer 107, but may be patterned by other techniques in other embodiments.

FIG. 4 also shows wafer 301 after an oxide layer 409 is formed with standard techniques on structures 401, 403, 405, and 407.

Figure 5:
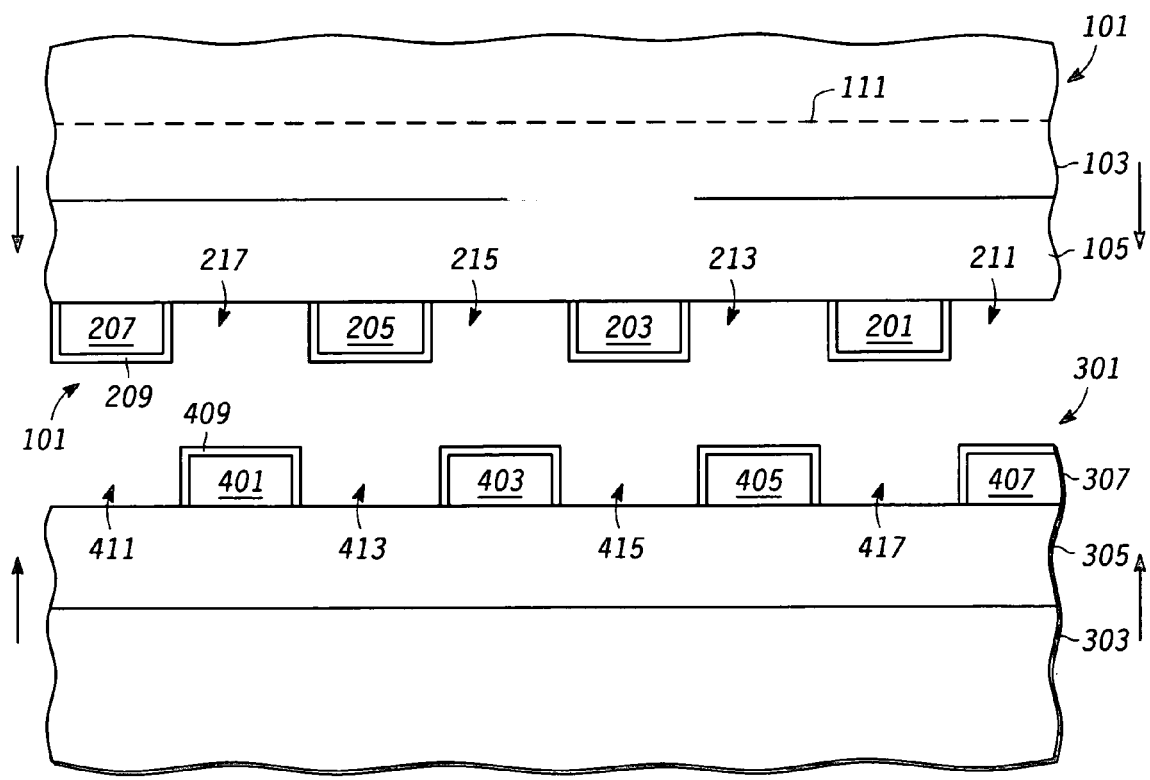

FIG. 5 shows a cross sectional view of wafer 101 and wafer 301 after wafer 101 is rotated so that its top surface faces the top surface of wafer 301. Once the wafers are aligned in such a position, the wafers 101 and 301 are brought together such that structures 207, 205, 203, and 201 are positioned in receptor openings 411, 413, 415, and 417, respectively and that structures 401, 403, 405, and 407 are positioned in receptor openings 217, 215, 213, and 211, respectively.

In some embodiments, wafers 101 and 301 are brought together with align and bonding tools. In one embodiment, the wafers are placed in the position as shown in FIG. 5 where an optical system is placed between the wafers to provide views of the top and bottom wafer. A wafer is then moved until it is aligned with the other, wherein the wafers are brought together after removing the optical system.

In other embodiments, infrared optics visualizing images through the wafers may be utilized to align the wafers. In one embodiment, the wave length of the infrared waves are greater than 1.1 microns. The wafers with such techniques may be double polished for clarity of the infrared waves passing through the wafers. Such techniques may be referred to as through wafer alignment. However, other alignment techniques may be utilized.

Figure 6:
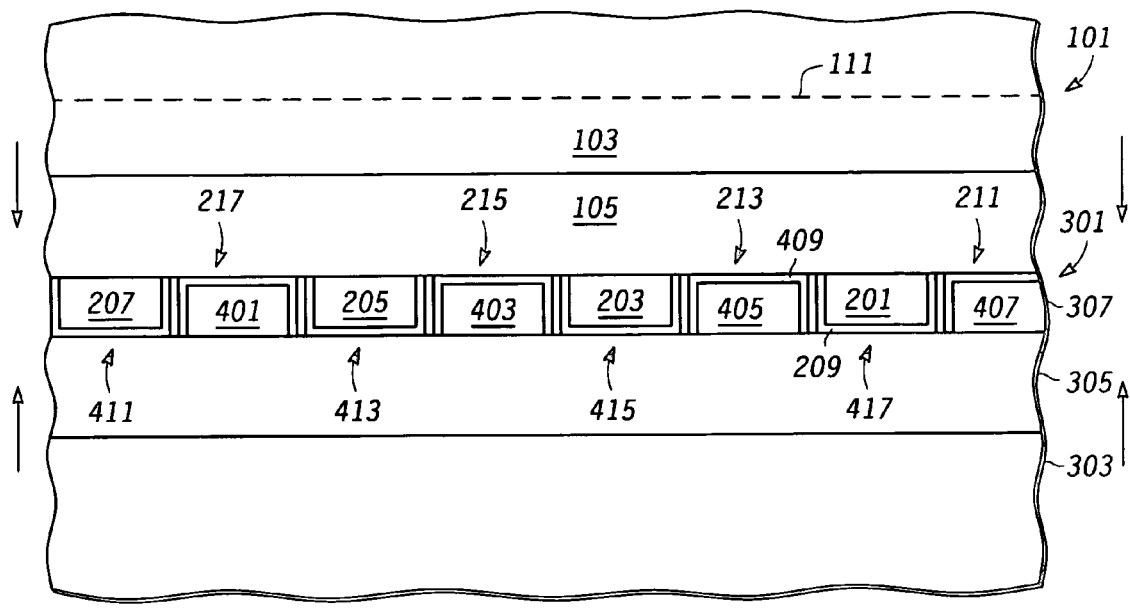

FIG. 6 shows a cross sectional side view after wafers 101 and 301 contact each other. In the view of FIG. 6, the portion of oxide layer 209 on top of structures 201, 203, 205, and 207 contact layer 305, and the portion of oxide layer 409 on structures 401, 403, 405, and 407 contact layer 105.

In one embodiment, the surfaces of the wafers are cleaned and treated prior to alignment and contact to enhance bonding.

After the wafers 101 and 301 are in contact with each other, the resultant structure may be heated (e.g. at up to 400 degrees C. or more) to bond wafer 301 to wafer 101. Although in some embodiments, the wafers may be bonded at room temperature. In such embodiments, the oxides of insulating layers 105 and 305 form covalent bonds with oxide layers 409 and 209, respectively. However, in other embodiments, wafers 101 and 301 may be bonded together by other techniques.

Some embodiments may not include layer 209 or 409. In some embodiments, oxide layers may be formed on layers 107 and 307 prior to the patterning to form the openings in those layers. In such embodiments, such oxide may be formed by thermal growth or chemical vapor deposition of an oxide material.

Figure 7:
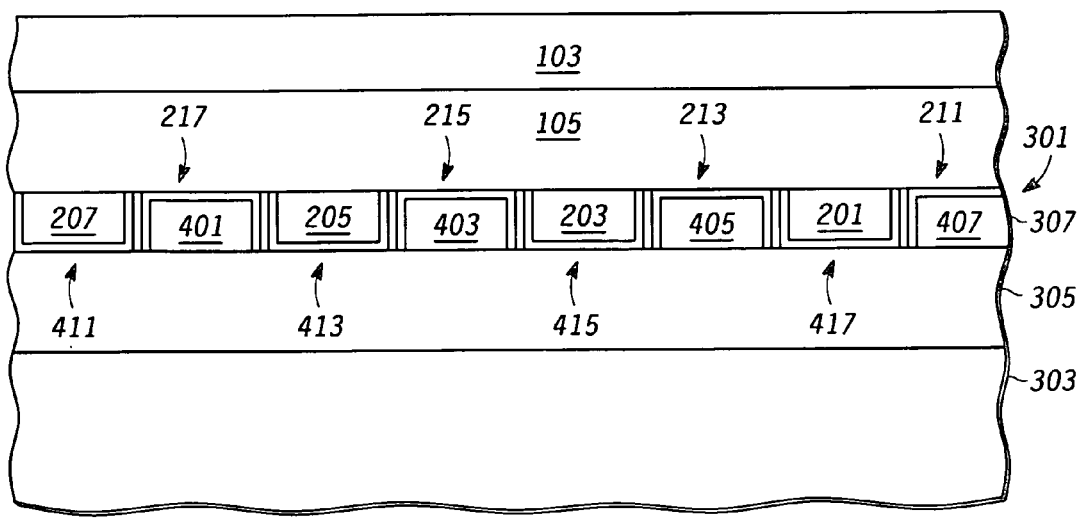

FIG. 7 shows a cross sectional side view of the resultant wafer after a bottom portion of wafer 101 has been removed by cleaving substrate layer 103 at the damaged region 111. In one embodiment, the cleaving is performed by heating the resultant structure at an elevated temperature (e.g. 500-1000 degrees C.). However, wafer 101 may be cleaved by other cleaving processes in other embodiments.

After cleaving, the remaining portion of substrate layer 103 is removed. In one embodiment, the remaining portion is removed by a chemical mechanical polish (CMP) or by etching.

Figure 8:
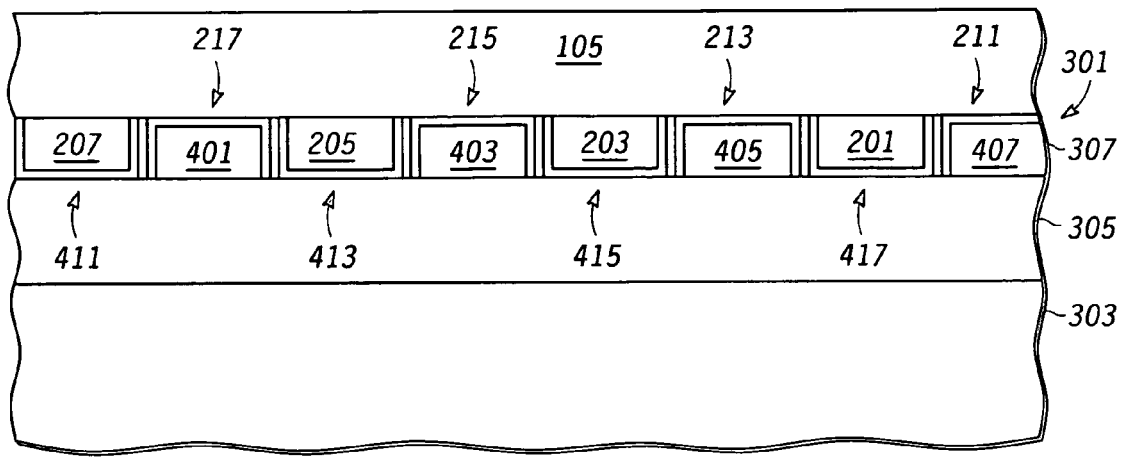

FIG. 8 shows a partial cross sectional side view of the resultant wafer after the remaining portion of substrate layer 103 has been removed. Following the removal of the remaining portion of substrate layer 103, layer 105 is removed. Layer 105 is preferably removed by a CMP process but may be removed by etching.

Figure 9:
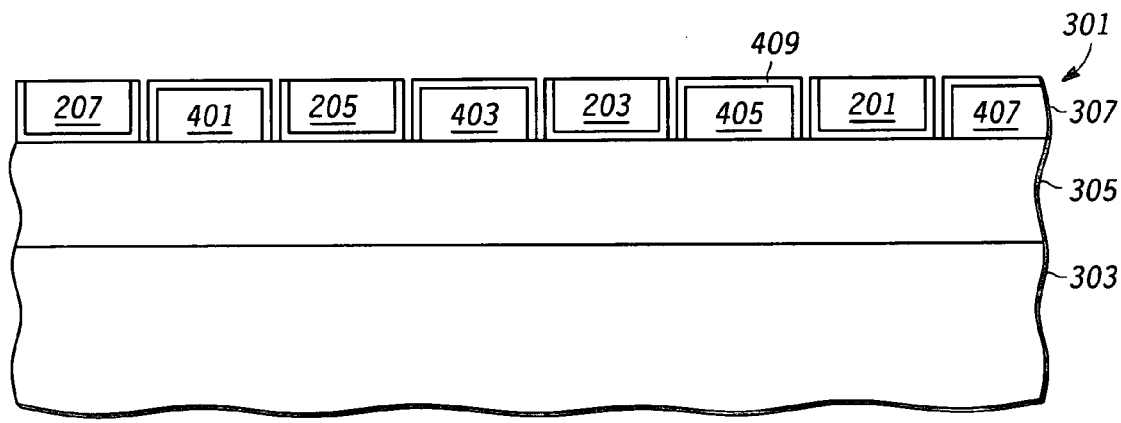

FIG. 9 shows a partial cross sectional side view of the resultant wafer after layer 105 has been removed. Note in FIG. 9, the top surface of the resultant wafer is planarized. Also, note that there may be gaps between the oxide layers on the sidewalls of structures 401, 403, 405, and 407 and the oxide on the sidewalls of structures 201, 203, 205, and 207.

Figure 10:
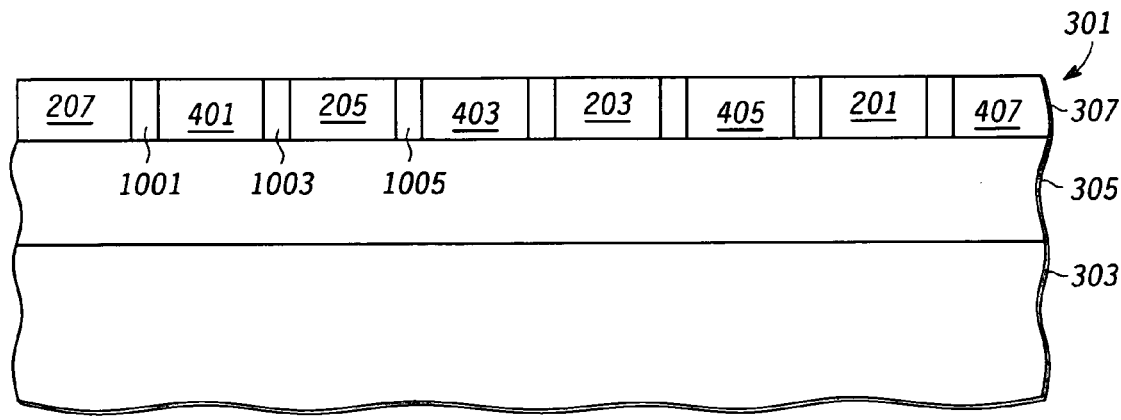

FIG. 10 shows a partial cross sectional side view of the resultant wafer after trench isolations are formed between structures 201, 203, 205, and 207 and structures 401, 403, 405, and 407. For example, trench isolation 1001 is formed between structures 207 and 401. Trench isolation 1003 is formed between structure 401 and structure 205, and trench isolation 1005 is formed between structure 205 and 403.

In the embodiment shown, these trench isolations may be formed at the locations where gaps exist between the oxides on the sidewalls of structures 201, 203, 205, 207, 401, 403, 405, and 407. The trench isolations remove the gaps and provide electrical isolation between the structures. In other embodiments, trench isolations (not shown) may be fabricated within structures 201, 203, 205, 207, 401, 403, 405, and 407 concurrently with the trench isolations shown in FIG. 10.

In one embodiment, the trench isolations are formed by depositing an oxide layer and a nitride layer (not shown), and patterning and etching the resultant wafer to form openings, depositing a layer of trench isolation material (e.g. TEOS, oxide high density plasma oxide) over the resultant wafer, and then planarizing the resultant wafer using the silicon of structures 201, 203, 205, and 207 as an etch stop. Once the absence of nitride is detected, planarization may continue or an oxide etch is done for a predetermined time to remove the oxide layer 409 on structures 401, 403, 405, and 407. The planarization leaves the exposed surfaces of structures 201, 203, 205, 207, 401, 403, 405, and 407 coplanar. The trench isolation maybe made by other techniques and/or formed of other materials in other embodiments. For example, the trench isolation material may be formed by an initial oxidation process followed by a TEOS deposition process.

The resultant wafer as shown in FIG. 10 includes regions of silicon having a surface orientation (100) (structures 201, 203, 205, and 207) interspersed with regions of silicon having a surface orientation of (110) (structure 401, 403, 405, and 407). All of which is located over an insulating layer 305 to provide a wafer having an SOI configuration and having active areas of different surface orientations.

In one embodiment, the utilization of two different wafers for the formation of active material may provide a wafer having relatively high quality active material from structures of different surface orientations. In some of these embodiments, the problems with selective epitaxial silicon growth (e.g. unwanted non epitaxial growth on dielectrics and defect formation at insulating sidewalls) may be avoided in the formation of the active regions. Also, in embodiments where the active layer is formed from bonding a donor wafer to an insulator, problems associated with forming an insulator layer in the epitaxially grown silicon may be avoided.

Figure 11:
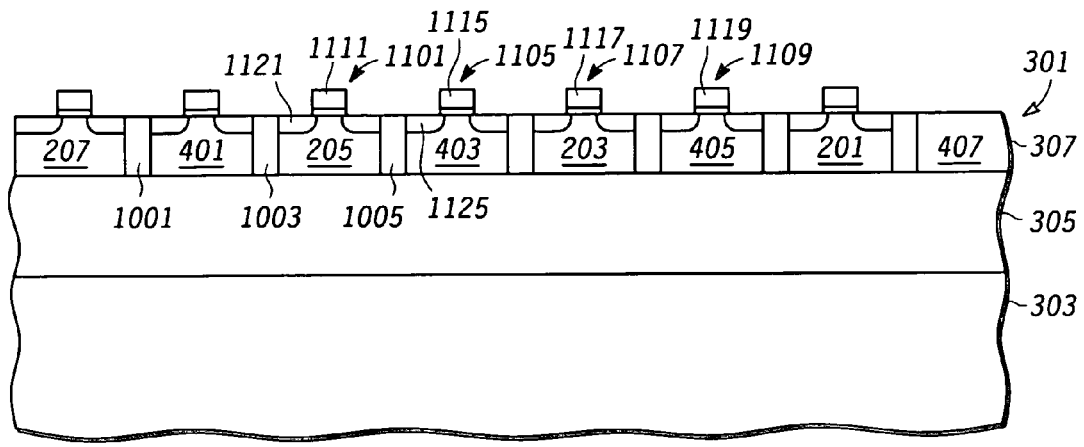

FIG. 11 shows a partial cross sectional side view of the resultant wafer after transistors are formed thereon. In the embodiment shown, transistor 1101 (having gate 1111) is formed with its channel region and source/drain regions (e.g. 1121) in structure 205 and transistor 1105 (having gate 1115) is formed with its channel region and source drain regions (1125) in structure 403. Transistor 1107 having gate 1117 is formed with its channel region and source/drain regions in structure 203, and transistor 1109 having gate 1119 is formed with its channel region and source/drain regions in structure 405. Source/drain regions are current electrode regions for field effect transistors. In some embodiments, the source/drain regions may have extensions.

In the embodiment shown, transistors 1101 and 1107 are N-channel devices having their channels formed in structures having a surface orientation (100) (structures 205, and 203) and transistors 1105 and 1109 are P-channel devices having their channels formed in structures having a surface orientation (110) (structures 403, and 405).

Although FIG. 11 shows only one transistor formed per structure (e.g. 201), in other embodiments, each structure may have multiple transistors. The multiple transistors may be of the same type, e.g. N-channel, or different types.

The resultant wafer may be subject to subsequent processes to form subsequent structures. For example, gate spacers, contacts, interconnect layers with interconnects and interlayer dielectrics, passivation layers, and external connector structures (e.g. bond pads, bumps) (none shown) may be formed on the resultant wafer. The resultant wafer may be singulated (e.g. with a saw) into individual integrated circuits and package into integrated circuit packages.

In some embodiments, wafer 101 would not include insulating layer 105 wherein structures 201, 203, 205, 207 may be formed by etching substrate layer 103 to a predetermined depth. FIGS. 12-18 show one such embodiment for forming active regions of different surface orientations accordingly to the present embodiment.

Figure 12:
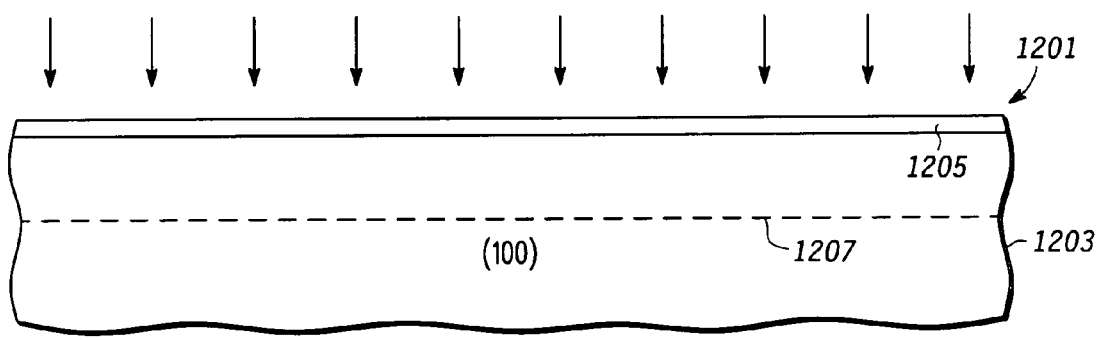
FIGS. 12-18 show partial cross sectional side views of various stages during the manufacture of semiconductor structures according to another embodiment of the present invention.

FIG. 12 shows a cross section of wafer 1201. Wafer 1201 includes a substrate layer 1203 of silicon having a surface orientation of (100). As shown in FIG. 12, hydrogen ions are implanted into substrate layer 1203 to form a damaged region 1207 for cleaving in subsequent processes. Subsequent to the implantation, an oxide layer 1205 is formed on substrate layer 1203 (e.g. by oxidation of substrate layer 1203 or deposition).

Figure 13:
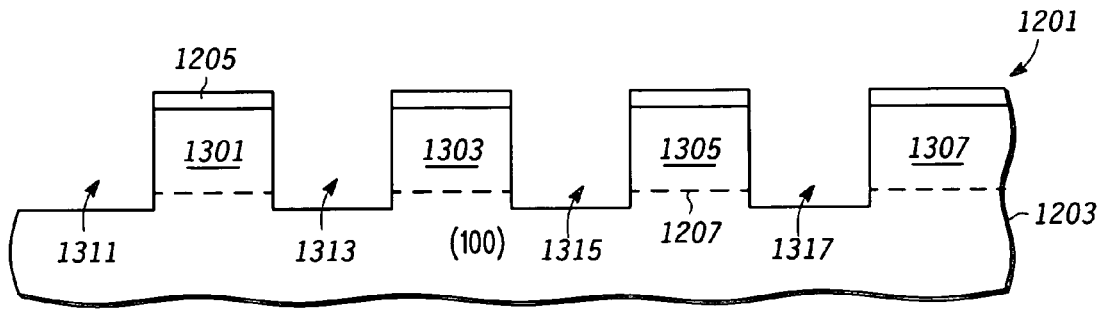

FIG. 13 shows a cross sectional view of wafer 1201 after patterning of substrate layer 1203 to form structures 1301, 1303, 1305, and 1307 of silicon having a surface orientation of (100). In one embodiment, structures 1301, 1303, 1305, and 1307 are formed by removing portions of layer 1205 at selected locates and subsequently etching substrate layer 1203 at the exposed locations for a predetermined time to forming openings 1311, 1313, 1315, and 1317 to a predetermined depth. In one embodiment, openings 1311, 1313, 1315, and 1317 are at a depth that is deeper than damaged region 1207.

Figure 14:
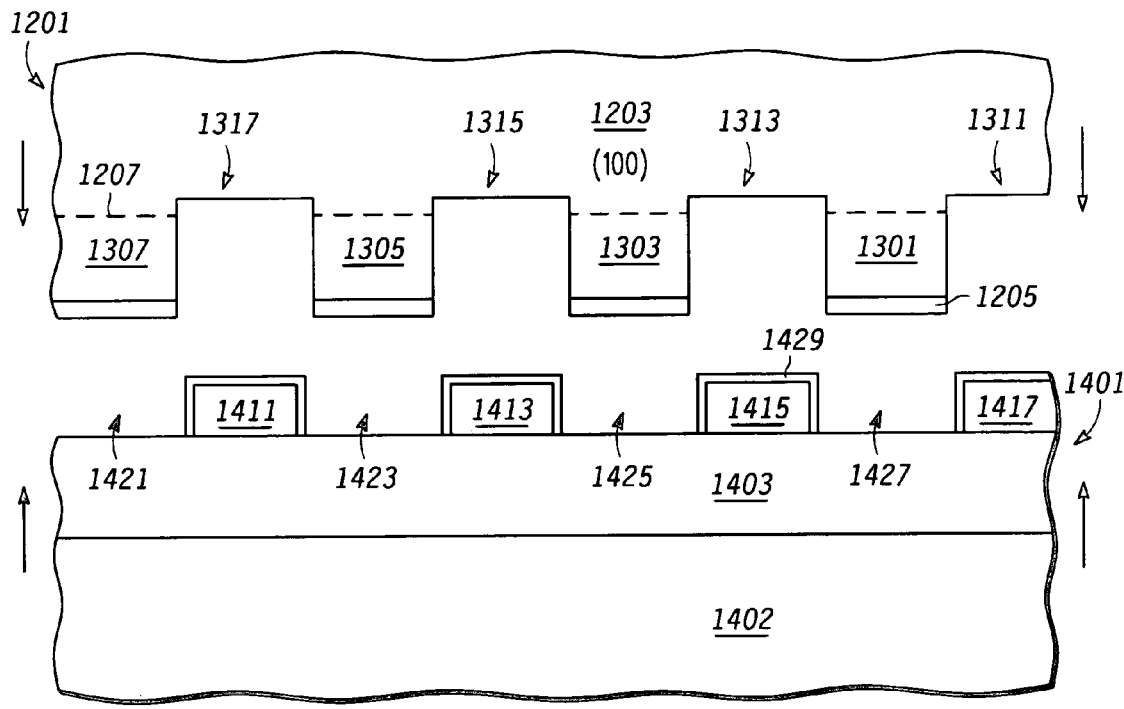

FIG. 14 shows a cross sectional view of wafer 1201 after it has been rotated and aligned with wafer 1401. Wafer 1401 includes a plurality of structures 1411, 1413, 1415, and 1417 that are of silicon (or other semiconductor material) having a surface orientation (110). Structures 1411, 1413, 1415, and 1417 are formed on insulator layer 1403 (e.g. silicon oxide) which is located on substrate layer 1402. Wafer 1401 includes openings 1421, 1423, 1425, and 1427. In one embodiment, wafer 1401 is formed in a similar manner as wafer 301 as described above. Also wafer 1201 may be aligned with wafer 1401 in a similar manner as described above with respect to the alignment of wafers 101 and 301.

Figure 15:
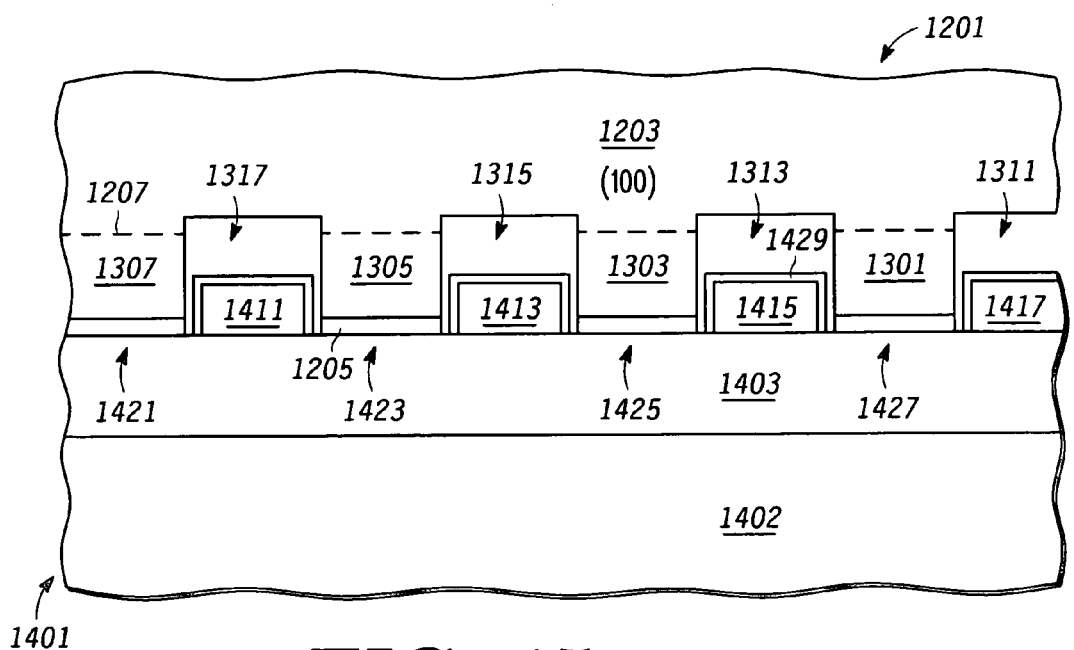

FIG. 15 shows a cross sectional view after wafers 1201 and 1401 have been brought together to contact each other. In FIG. 15, structures 1307, 1305, 1303, and 1301 reside in receptor openings 1421, 1423, 1425, and 1427, respectively. Also structures 1411, 1413, 1415, and 1417 reside in receptor openings 1317, 1315, 1313, and 1311 respectively.

In the embodiment shown, the oxide layer 1205 contacts insulating layer 1403. As shown in FIG. 15, the top of oxide layer 1429 on structures 1411, 1413, 1415, and 1417 does not contact the bottom of openings 1317, 1315, 1313, and 1311 respectively, in that the depth of these openings is greater than the height of the structures.

After wafers 1201 and 1401 contact each other, the wafers are bonded together wherein in one embodiment, the oxide of layer 1205 forms covalent bonds with the oxide of layer 1403. However, the wafers may be bonded by other processes including those described above.

Figure 16:
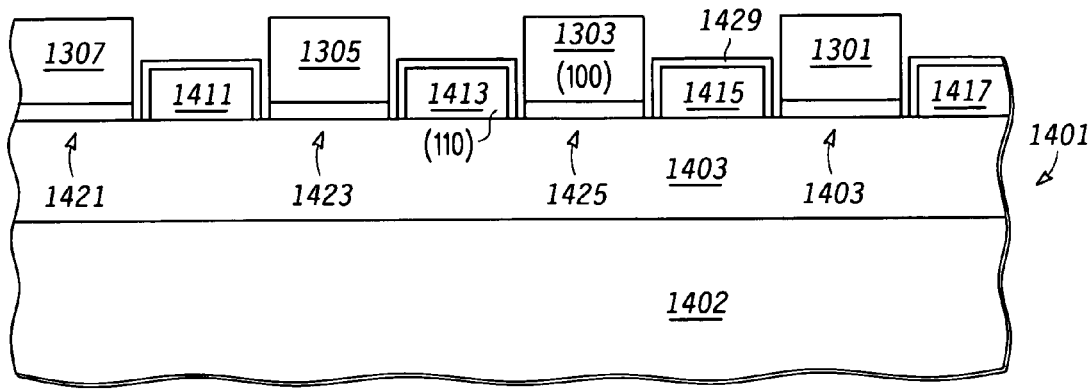

FIG. 16 shows the resultant wafer structure after substrate layer 1203 has been removed by cleaving at damaged region 1207.

Figure 17:
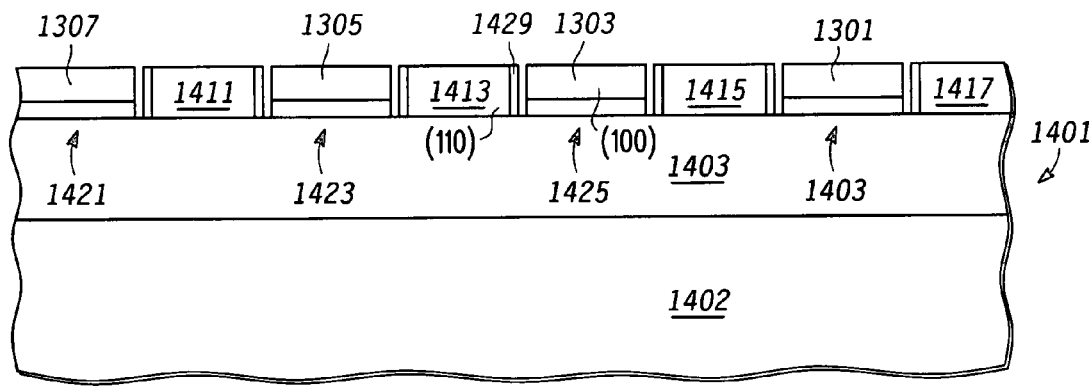

FIG. 17 shows the resultant wafer after it has been planarized (e.g. by a CMP process) such that structures 1307, 1305, 1303, and 1301 are the same height as structures 1411, 1413, 1415, and 1417 and that oxide layer 1429 has been removed from the top of structures 1411, 1413, 1415, and 1417. In one embodiment, the resultant wafer is planarized until oxide layer 1429 is reached. At which time, planarization continues for a predetermined time or an oxide etch is done so that oxide layer 1429 is removed from structures 1411, 1413, 1415, and 1417. However, in other embodiments, the wafer may be planarized by other techniques.

As shown in FIG. 17, gaps may exists between structures 1307, 1305, 1303, and 1301 and the oxide layer 1429 on the side walls of structures 1411, 1413, 1415, and 1417.

Figure 18:
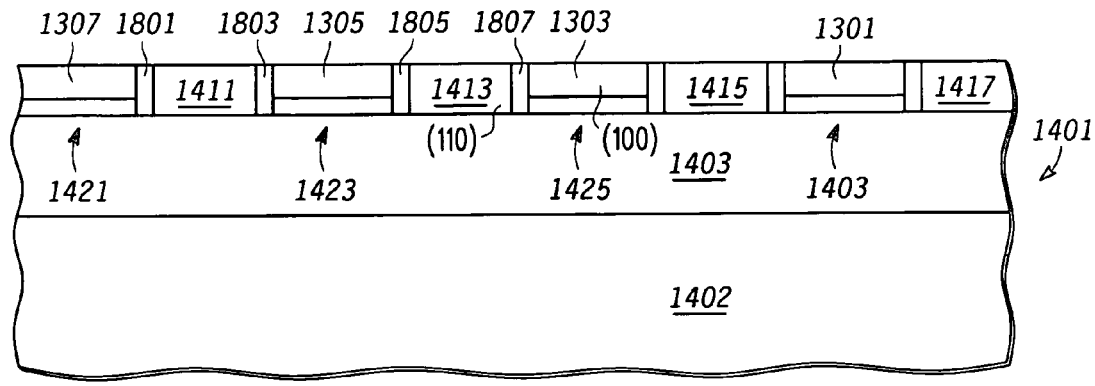

FIG. 18 shows a cross sectional view of the resultant wafer after trench isolation is formed between the structures at the location of the gaps. In the embodiment shown, trench isolation 1801 is formed between structure 1307 and structure 1411, trench isolation 1803 is formed between structure 1411 and structure 1305, trench isolation 1805 is formed between structure 1305 and structure 1413, and trench isolation 1807 is formed between structure 1413 and structure 1303. In other embodiments, trench isolations may be formed within the structures.

In subsequent processes, P-channel transistors may be formed having channel regions in structures 1411, 1413, 1415, and 1417 (the structures having surface orientations of (110). N-channel transistor may be formed having channel regions in structures 1307, 1305, 1303, 1301 (the structures having surface orientations of (100)). See the text above regarding FIG. 12. Also, subsequent processes may be performed on the wafer after the formation of the transistors (see the text above).

FIGS. 19-23 show partial cross sectional views of another embodiment for forming structures with different surface orientations. In the embodiments of FIGS. 1-12 and 13-18, the structures having one particular surface orientation (e.g. (100)) are formed on a donor wafer wherein the donor wafer is brought into contact with the handle wafer having structures of another surface orientation (e.g. (110)). Subsequently, the remaining portions of the donor wafer is removed. In the embodiment of FIGS. 19-23, semiconductor structures having a first surface orientation are formed on a donor wafer and then removed from the donor wafer. Those structures are then located in receptor openings of a handle wafer having structures of a second surface orientation by flowing a liquid containing the structures over the handle wafer.

Figure 19:
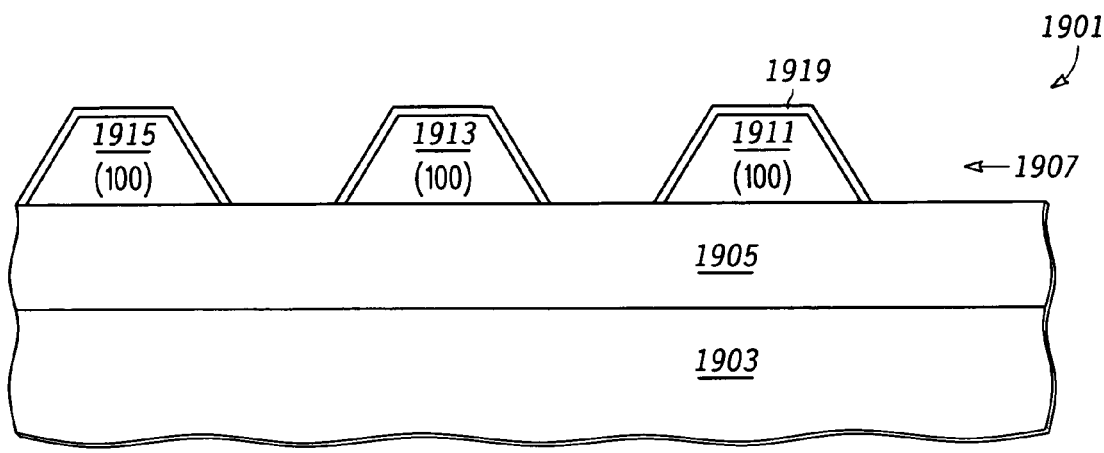
FIGS. 19-23 show partial cross sectional side views of various stages during the manufacture of semiconductor structures according to another embodiment of the present invention.

FIG. 19 shows a cross sectional view of a donor wafer 1901. Donor wafer 1901 includes a substrate layer 1903 and an insulating layer 1905 thereon. In some embodiments, layer 1905 is not included. Structures 1915, 1913, and 1911 have been formed from a silicon layer 1907 (or other type of semiconductor material in other embodiments). An oxide layer 1919 has been formed on structures 1915, 1913, and 1911.

In the embodiment of FIG. 19, structures 1915, 1913, and 1911 have a trapezoidal cross section. This cross section is formed by etching with an reactive ion etching (RIE) process, with a plasma, or with an etch that has an ability to form the sloped sidewalls. However, in other embodiments, the side walls may be vertical.

After the stage shown in FIG. 19, structure 1915, 1913, and 1911 are removed from wafer 1901. In one embodiment, these structures are removed by etching layer 1905 so as to under cut the material of layer 1905 below structures 1915, 1913, and 1911. This etching also removes oxide layer 1919. During the etching, structures 1915, 1913, and 1911 are suspended in the enchant. Structures 1915, 1913, and 1911 are then transferred to an applications solution.

In one embodiment, oxide layer 1919 is not formed. Also, in other embodiments, structures 1915, 1913, and 1911 may be separated from wafer 1901 by forming a damaged region in those structures (or in the layer from which the structures are formed prior to patterning), and then cleaving the structures at the damaged region.

Figure 20:
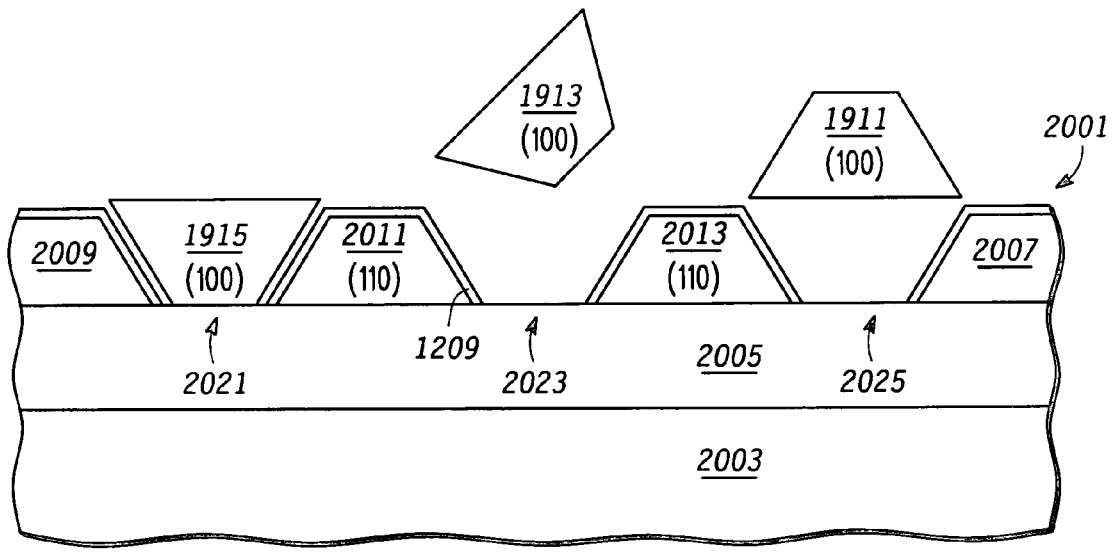

Referring to FIG. 20, after the structures are transferred to the applications fluid, the applications fluid with the structures is flowed across a wafer 2001 including receptor openings 2021, 2023, and 2025 between semiconductors structures 2009, 2011, 2013, and 2007 having a surface orientation of (110) that are located on an insulating layer 2005 of wafer 2001. Layer 2005 is located on substrate layer 2003. In the embodiment shown, structures 2009, 2011, 2013, and 2007 have sloped side walls of a similar slope to those of structures 1915, 1913, and 1911.

In the embodiment shown, openings 2021, 2023, and 2025 are sized and shaped to received structures 1915, 1913, and 1911 in an upside down position (the position of structure 1915 in FIG. 20). In the embodiment of FIG. 20, those structures (e.g. 1911) that are not situated in the correct orientation (e.g. structure 1911) will not fit in an opening (e.g. 2025).

In one embodiment, the application fluid does not oxidize the silicon of semiconductor structures (e.g. 1913, 1911).

In other embodiments, the structures (e.g. 1913) to be received in the openings (e.g. 2023) of wafer 2001 may have different shapes and/or sizes. In some embodiments, the openings would have the same generally complimentary shape and size as the openings.

During the application process, the wafer may be rotated and ultrasound or other wafer movement mechanisms may be applied in some embodiments to ensure a higher filling of structures in the openings. During the application process, van der Waals forces provide a bonding force to bond the structures in the openings.

Figure 21:
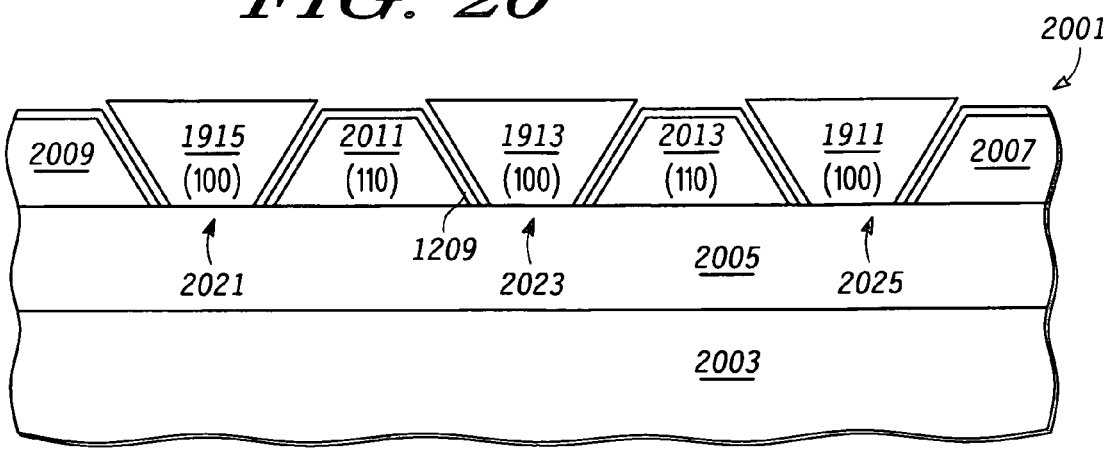

FIG. 21 shows a cross sectional view of wafer 2001 wherein all of the receptor openings (2021, 2023, 2025) have received a corresponding structure in the correct orientation. At this time, the wafer may be heated to enhance the bonding of the structures in the openings.

Figure 22:
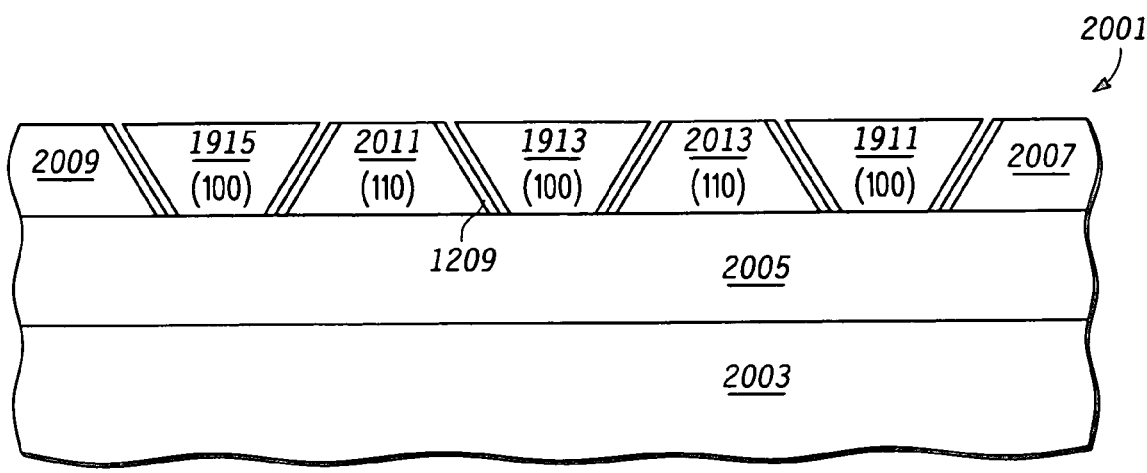

FIG. 22 shows a side view of wafer 2001 after it has been planarized (e.g. by a CMP process).

Figure 23:
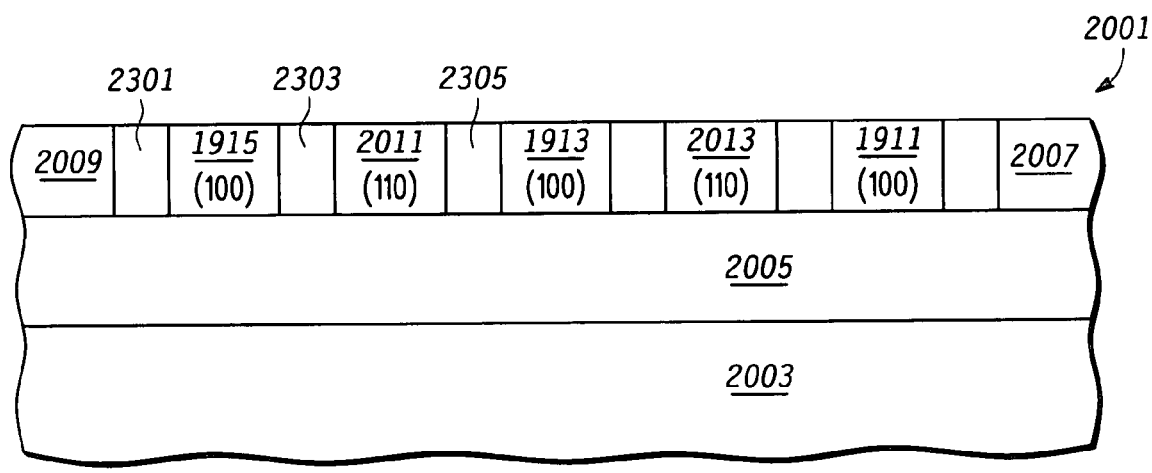

FIG. 23 shows a side view of wafer 2001 after trench isolation (e.g. 2301, 2303, 2305) have been formed between the structures of different surface orientations. Trench isolation 2301 is formed between structure 2009 and structure 1915. Trench isolation 2303 is formed between structures 1915 and 2011, and trench isolation 2305 is formed between structure 2011 and 1913. In other embodiments, trench isolations may be formed within the structures.

In subsequent processes, P-channel transistors may be formed having channel regions in structures 2009, 2011, 2013, and 2007 (the structures having surface orientations of (110). N-channel transistors may be formed having channel regions in structures 1915, 1913, and 1911 (the structures having surface orientations of (100)). See the text above regarding FIG. 12. Also, subsequent processes may be performed on the wafer after formation of the transistors (see the text above).

In the embodiments shown and described, structures of one surface orientation (100) are formed on a donor wafer and then subsequently located on a handle wafer with structures of a second orientation (110) formed thereon. However, in other embodiments, structures having a surface orientation (110) may be formed on a donor wafer and then subsequently located on a handle wafer with structures having a surface orientation (100) formed thereon according to the embodiments described above. Also, structures having other surface orientations (e.g. (111)) may be utilized in the processes described above.

In one embodiment, a method of making a semiconductor device includes providing a first wafer having a semiconductor layer of a first surface orientation, selectively etching the semiconductor layer to form semiconductor structures of the first surface orientation and receptor openings, and providing semiconductor structures of a second surface orientation different from the first surface orientation. The method also includes locating the semiconductor structures of the second surface orientation into the receptor openings, forming transistors of a first type in the semiconductor structures of the first surface orientation, and forming transistors of a second type different from the first type in the semiconductor structures of the second surface orientation.

In another embodiment, a method of making a semiconductor device includes providing a wafer having a first plurality of semiconductor structures above an insulating layer. The semiconductor structures have a first surface orientation. The method includes applying a second plurality of semiconductor structures having a second surface orientation different from the first surface orientation between the first plurality of semiconductor structures and forming a substantially planar surface on the wafer. The substantially planar surface includes the first plurality of semiconductor structures, the second plurality of semiconductor structures, and isolation regions between the first plurality of semiconductor structures and the second plurality of semiconductor structures. The method includes forming transistors of a first type having their channel regions in the first plurality of semiconductor structures and forming transistors of a second type different from the first type having their channel regions in the second plurality of semiconductor structures.

Another embodiment includes a method of forming an integrated circuit having enhanced transistor mobility for two different types of transistors. The method includes providing a first semiconductor layer having a first plurality of semiconductor structures of a first surface orientation, providing a second semiconductor layer having a second plurality of semiconductor structures of a second surface orientation different from the first surface orientation, and applying the second semiconductor layer to the first semiconductor layer. The method also includes forming a planar surface comprised of the first plurality of semiconductor structures, the second plurality of semiconductor structures, and isolation regions, and using the planar surface to form transistors of two different channel types.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a semiconductor device, comprising:
    providing a first wafer having a semiconductor layer of a first surface orientation;
    selectively etching the semiconductor layer to form semiconductor structures of the first surface orientation and receptor openings;
    providing semiconductor structures of a second surface orientation different from the first surface orientation;
    locating the semiconductor structures of the second surface orientation into the receptor openings;
    forming transistors of a first type in the semiconductor structures of the first surface orientation; and
    forming transistors of a second type different from the first type in the semiconductor structures of the second surface orientation;
    wherein providing the semiconductor structures of the second surface orientation comprises
        providing a second wafer having a semiconductor layer of the second surface orientation; and
        selectively etching the semiconductor layer of the second wafer to form the semiconductor structures of the second surface orientation.

2. The method of claim 1, wherein:
    the first surface orientation is (100);
    the transistors of the first type are N channel transistors;
    the second surface orientation is (110); and
    the transistors of the second type are P channel transistors.

3. The method of claim 1, wherein:
    the first surface orientation is (110);
    the transistors of the first type are P channel transistors;
    the second surface orientation is (100); and
    the transistors of the second type are N channel transistors.

4. The method of claim 1, wherein the second wafer comprises a semiconductor substrate layer, an insulating layer over the semiconductor substrate layer, and the semiconductor layer over the insulating layer.

5. The method of claim 4, further comprising implanting hydrogen into the semiconductor substrate layer to form a damaged layer in the semiconductor substrate layer.

6. The method of claim 5, wherein the locating the semiconductor structures of the second surface orientation comprises:
    contacting the first and second wafers to each other to place the semiconductor structures of the second surface orientation into the receptor openings;
    cleaving the semiconductor substrate layer along the damaged layer to leave a remaining portion of the semiconductor substrate layer adjacent to insulating layer;
    removing the remaining portion of the semiconductor substrate layer;
    removing the insulating layer; and
    chemical-mechanical polishing the semiconductor structures of the first surface orientation and the semiconductor structures of the second surface orientation to leave surfaces that are substantially coplanar.

7. The method of claim 1, wherein the semiconductor layer of the second wafer has receptor openings, the method further comprising:
    locating the semiconductor structures of the first surface orientation into the receptor openings of the second wafer.

8. The method of claim 1, wherein the locating the semiconductor structures of the second surface orientation comprises:
    contacting the first and second wafers to each other to place the semiconductor structures of the second surface orientation into the receptor openings; and
    cleaving the semiconductor layer of the second surface orientation thereby leaving the semiconductor structures of the second surface orientation in the receptor openings.

9. The method of claim 8, wherein the cleaving further comprises:
    implanting the semiconductor layer of the second wafer with hydrogen to form a damaged layer, wherein the cleaving occurs at the damaged layer.

10. The method of claim 8, further comprising chemical-mechanical polishing the semiconductor structures of the first surface orientation and the semiconductor structures of the second surface on entation to leave surfaces on the semiconductor structures of the first surface orientation and the semiconductor structures of the second surface orientation that are substantially coplanar.

11. The method of claim 10, further comprising forming isolation regions between the semiconductor structures of the first surface orientation and the semiconductor structures of the second surface orientation.

12. The method of claim 11, further comprising:
    locating the semiconductor structures of the second surface orientation into the receptor openings of the first wafer.

13. The method of claim 1, further comprising forming isolation regions between the semiconductor structures of the first surface orientation and the semiconductor structures of the second surface orientation.

14. A method of making a semiconductor device, comprising:

providing a first wafer having a semiconductor layer of a first surface orientation:

selectively etching the semiconductor layer to form semiconductor structures of the first surface orientation and receptor openings;

providing semiconductor structures of a second surface orientation different from the first surface orientation;

locating the semiconductor structures of the second surface orientation into the receptor openings;

forming transistors of a first type in the semiconductor structures of the first surface orientation; and forming transistors of a second type different from the first type in the semiconductor structures of the second surface orientation wherein providing the semiconductor structures of the second surface orientation comprises:

providing a plurality of unattached semiconductor structures having, the second surface orientation.

15. The method of claim 14, wherein:

the receptor openings have a predetermined shape and the plurality of unattached semiconductor structures have generally the same predetermined shape;

the locating semiconductor structures of the second surface orientation comprises:

flowing a liquid containing the plurality of unattached semiconductor structures over the first wafer so that the plurality of unattached semiconductor structures fall into the receptor openings; and wherein the plurality of unattached semiconductor structures are bonded to the receptor openings.

16. The method of claim 15, further comprising chemical-mechanical polishing the semiconductor structures of the first surface orientation and the semiconductor structures of the second surface orientation to leave surfaces on the semiconductor structures of the first surface orientation and the semiconductor structures of the second surface orientation that are substantially coplanar.

17. The method of claim 1 wherein:

the forming transistors of a first type in the semiconductor structures of the first surface orientation further includes forming channel regions and current electrode regions of the transistors of the first type in the semiconductor structures of the first surface orientation; and the forming transistors of a second type in the semiconductor structures of the second surface orientation further includes forming channel regions and current electrode regions of the transistors of the second type in the semiconductor structures of the second surface orientation.

18. A method of making a semiconductor device, comprising:

providing a wafer having a first plurality of semiconductor structures above an insulating layer, wherein the semiconductor structures have a first surface orientation;

applying a second plurality of semiconductor structures having a second surface orientation different from the first surface orientation between the first plurality of semiconductor structures and over the insulating layer; and forming a substantially planar surface on the wafer, wherein the substantially planar surface comprises the first plurality of semiconductor structures, the second plurality of semiconductor structures, and isolation regions between the first plurality of semiconductor structures and the second plurality of semiconductor structures;

forming transistors of a first type having their channel regions in the first plurality of semiconductor structures; and forming transistors of a second type different from the first type having their channel regions in the second plurality of semiconductor structures.

19. The method of claim 18, wherein transistors of the first type are characterized as having a higher carrier mobility when their channel regions are formed in a semiconductor material having the first surface orientation than in the second surface orientation.

20. The method of claim 18, further comprising:

forming the second plurality of semiconductor structures, wherein the forming the second plurality of semiconductor structures further comprises:

providing a second wafer having a semiconductor layer of the second surface orientation; and selectively etching the semiconductor layer of the second wafer to form the second plurality of semiconductor structures.

21. The method of claim 1, further comprising planarizing the semiconductor structures of the first surface orientation and the semiconductor structures of the second surface orientation to leave surfaces on the semiconductor structures of the first surface orientation and the semiconductor structures of the second surface orientation that are substantially coplanar.

* * * * *

UNITED STATES PATENT AND TRADEMARK OFFICE
CERTIFICATE OF CORRECTION

| | | |
|---|---|---|
| PATENT NO. | : 7,288,458 B2 | Page 1 of 1 |
| APPLICATION NO. | : 11/302770 | |
| DATED | : December 14, 2005 | |
| INVENTOR(S) | : Olubunmi O. Adetutu | |

It is certified that error appears in the above-identified patent and that said Letters Patent is hereby corrected as shown below:

In Column 10, Line 49, Claim 10:
Change "the second surface on entation to leave surfaces" to --the second surface orientation to leave surfaces--

In Column 11, Line 2, Claim 14:
Change "first surface orientation:" to --first surface orientation;--

In Column 11, Line(s) 14-18, Claim 14:
Change "wherein providing the semiconductor structures of the second surface orientation comprises: providing a plurality of unattached semiconductor structures having, the second surface orientation." to --wherein the providing the semiconductor structures of the second surface orientation comprises providing a plurality of unattached semiconductor structures having the second surface orientation.--

Signed and Sealed this

Tenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,288,458 B2
APPLICATION NO. : 11/302770
DATED : October 30, 2007
INVENTOR(S) : Olubunmi O. Adetutu It is certified that error appears in the above-identified patent and that said Letters Patent is hereby corrected as shown below:

In Column 10, Line 49, Claim 10:
Change "the second surface on entation to leave surfaces" to --the second surface orientation to leave surfaces--

In Column 11, Line 2, Claim 14:
Change "first surface orientation:" to --first surface orientation;--

In Column 11, Line(s) 14-18, Claim 14:
Change "wherein providing the semiconductor structures of the second surface orientation comprises: providing a plurality of unattached semiconductor structures having, the second surface orientation." to --wherein the providing the semiconductor structures of the second surface orientation comprises providing a plurality of unattached semiconductor structures having the second surface orientation.--

This certificate supersedes the Certificate of Correction issued June 10, 2008.

Signed and Sealed this

Fifteenth Day of July, 2008

JON W. DUDAS
*Director of the United States Patent and Trademark Office*